United States Patent
Fishley et al.

(10) Patent No.: US 7,804,167 B2
(45) Date of Patent: Sep. 28, 2010

(54) WIRE BOND INTEGRATED CIRCUIT PACKAGE FOR HIGH SPEED I/O

(75) Inventors: Clifford Fishley, San Jose, CA (US); Abiola Awujoola, Pleasanton, CA (US); Leonard Mora, San Jose, CA (US); Amar Amin, Milpitas, CA (US); Maurice Othieno, Union City, CA (US); Chok J. Chia, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 336 days.

(21) Appl. No.: 11/565,701

(22) Filed: Dec. 1, 2006

(65) Prior Publication Data

US 2008/0128919 A1    Jun. 5, 2008

(51) Int. Cl.
*H01L 23/528* (2006.01)
*H01L 21/768* (2006.01)

(52) U.S. Cl. .................. 257/691; 257/786; 257/692; 257/784; 257/782; 257/E23.079; 257/E23.153; 257/E21.575; 438/666; 438/612; 438/622

(58) Field of Classification Search ............... 257/691, 257/786, 692, 695, 784, 782, E23.079, E23.153, 257/E21.575; 438/666, 612, 622
See application file for complete search history.

(56) References Cited

U.S. PATENT DOCUMENTS

| | | | | |
|---|---|---|---|---|
| 5,066,831 A * | 11/1991 | Spielberger et al. | ......... | 174/262 |
| 5,150,280 A * | 9/1992 | Arai et al. | .................... | 361/783 |
| 6,064,113 A * | 5/2000 | Kirkman | ..................... | 257/691 |
| 6,452,262 B1 * | 9/2002 | Juneja | ......................... | 257/691 |
| 6,538,336 B1 * | 3/2003 | Secker et al. | ................ | 257/786 |
| 6,572,743 B2 | 6/2003 | Miller et al. | .......... | 204/297.06 |
| 6,747,362 B2 * | 6/2004 | Barrow | ....................... | 257/786 |
| 6,770,963 B1 * | 8/2004 | Wu | ............................. | 257/691 |
| 6,777,802 B1 * | 8/2004 | Mora et al. | ................. | 257/691 |
| 6,908,855 B2 | 6/2005 | Kuzawinski et al. | ........ | 438/637 |
| 6,930,381 B1 * | 8/2005 | Cornelius | ................... | 257/692 |
| 7,420,286 B2 * | 9/2008 | Kramer | ...................... | 257/784 |
| 7,501,709 B1 * | 3/2009 | Hool et al. | .................. | 257/784 |

* cited by examiner

*Primary Examiner*—Jerome Jackson, Jr.
*Assistant Examiner*—Yu Chen
(74) *Attorney, Agent, or Firm*—Ottersedt, Ellenbogen & Kammer, LLP

(57) ABSTRACT

An integrated circuit package includes a package substrate, a die attach pad formed on the package substrate for securing a die to the package substrate, a ground bonding ring formed on the package substrate for attaching core and I/O ground bond wires between the die and the package substrate, and a first plurality of bond fingers formed immediately adjacent to the ground bonding ring for attaching a first set of I/O signal bond wires between the package substrate and the die.

17 Claims, 8 Drawing Sheets

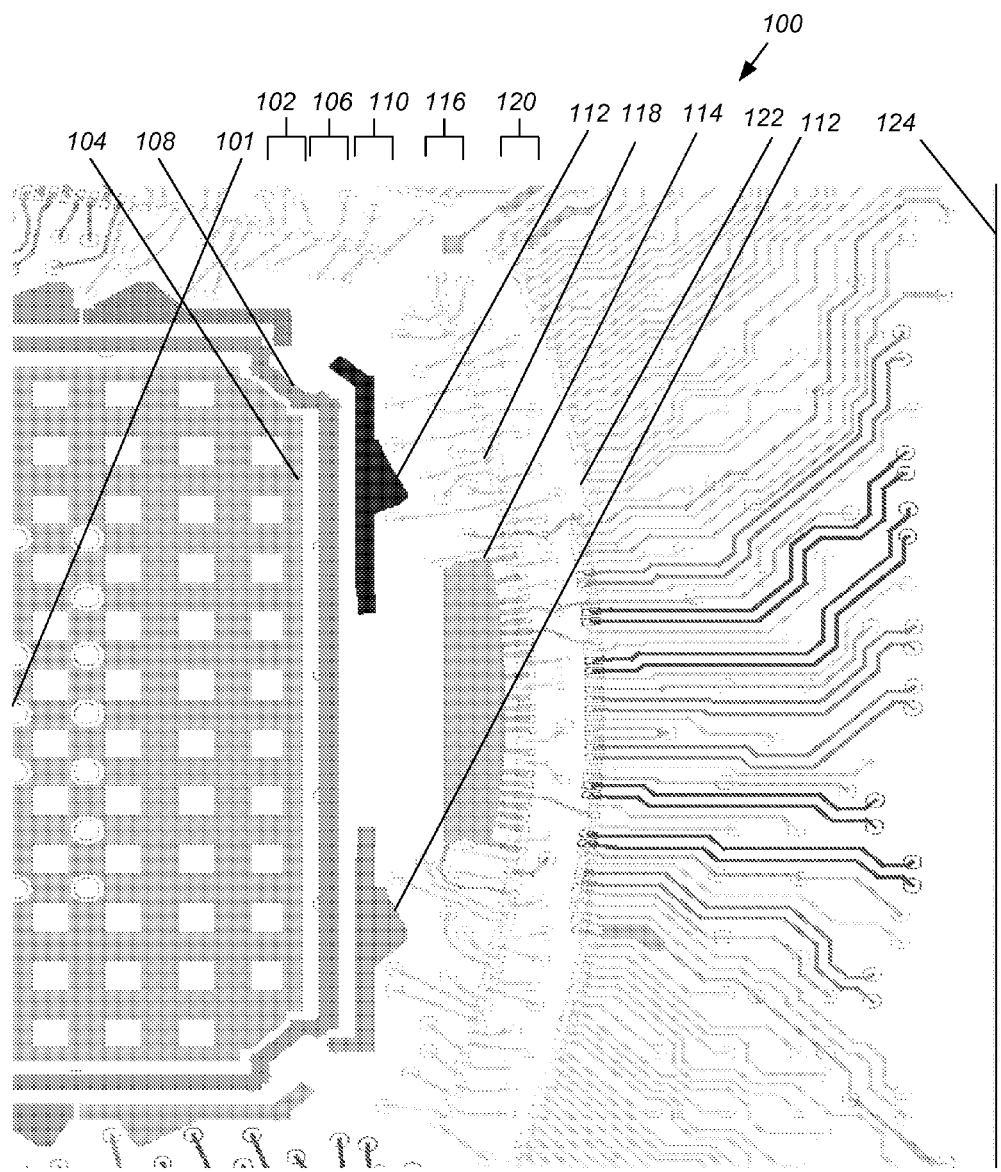
FIG._1
(PRIOR ART)

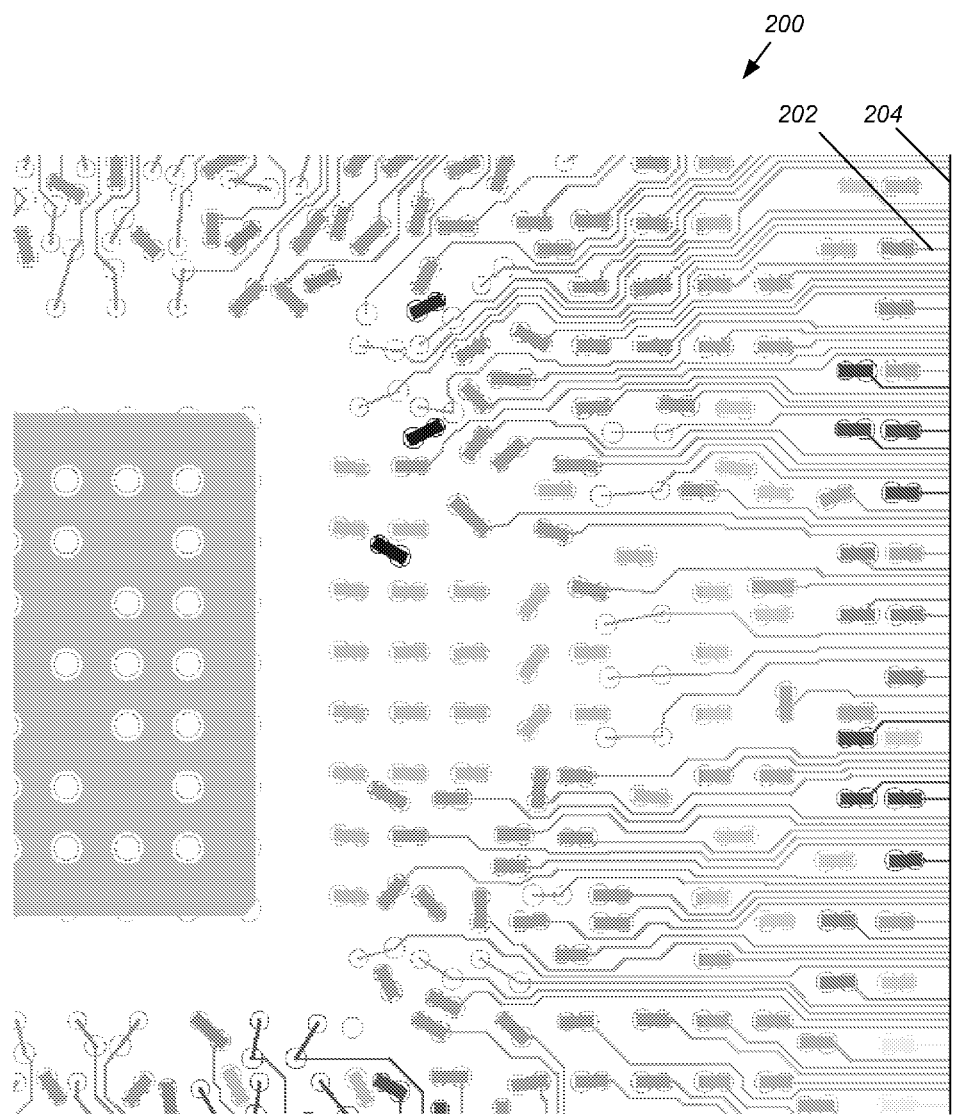
FIG._2
(PRIOR ART)

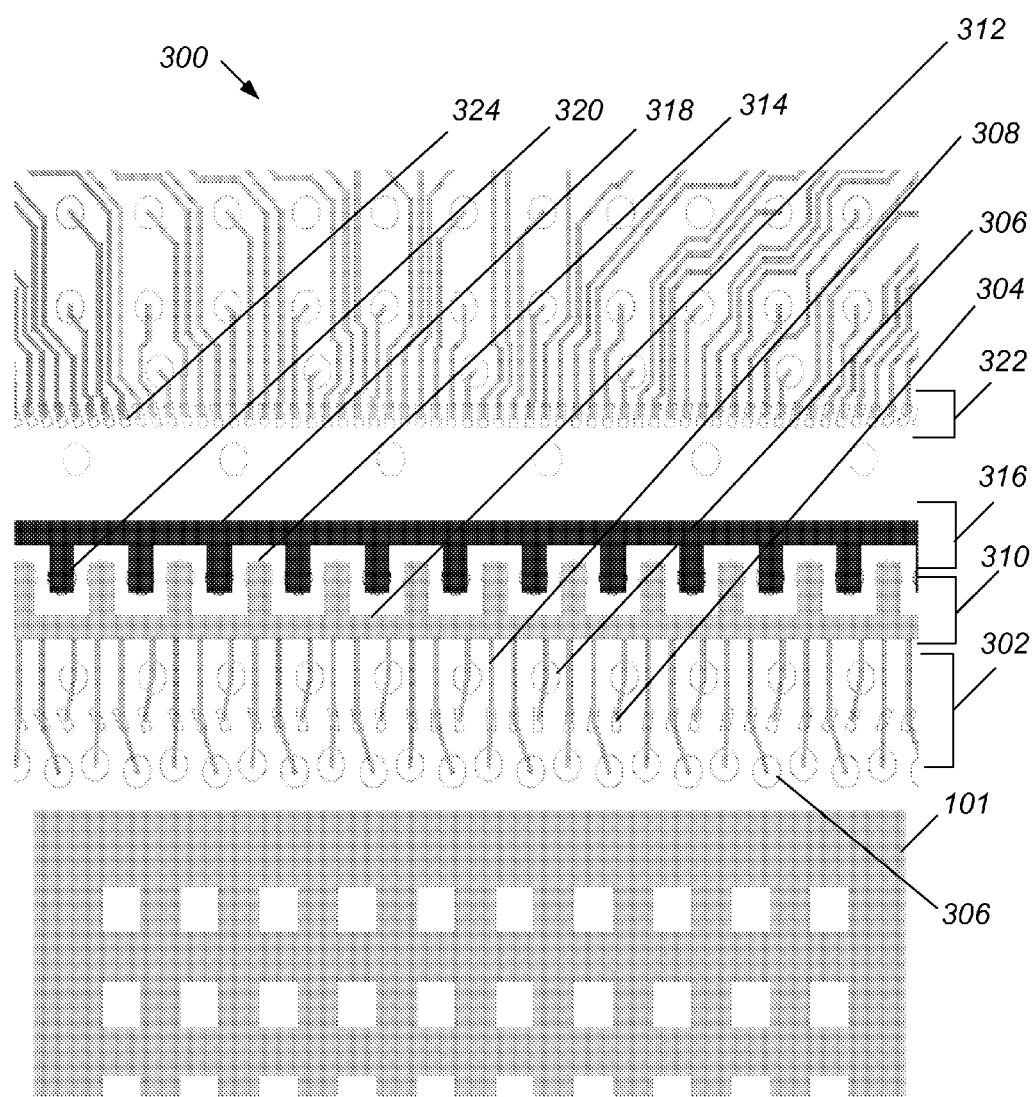
FIG._3

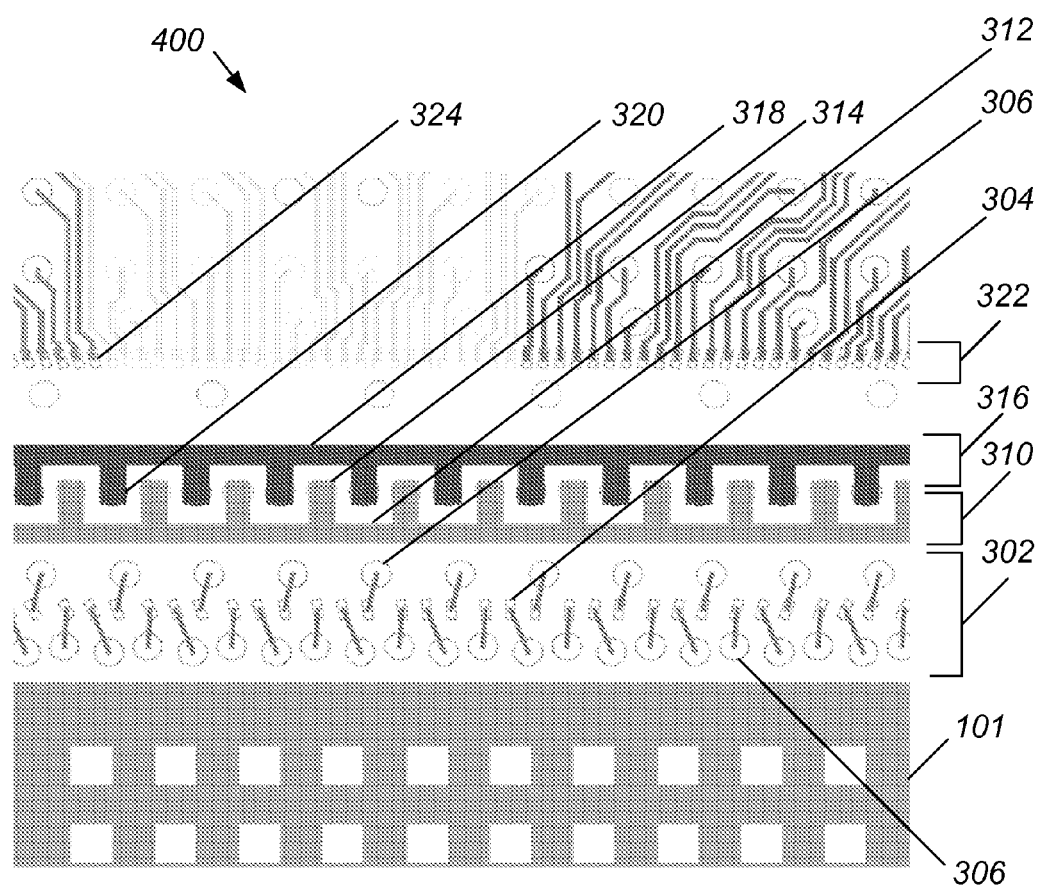
FIG._4

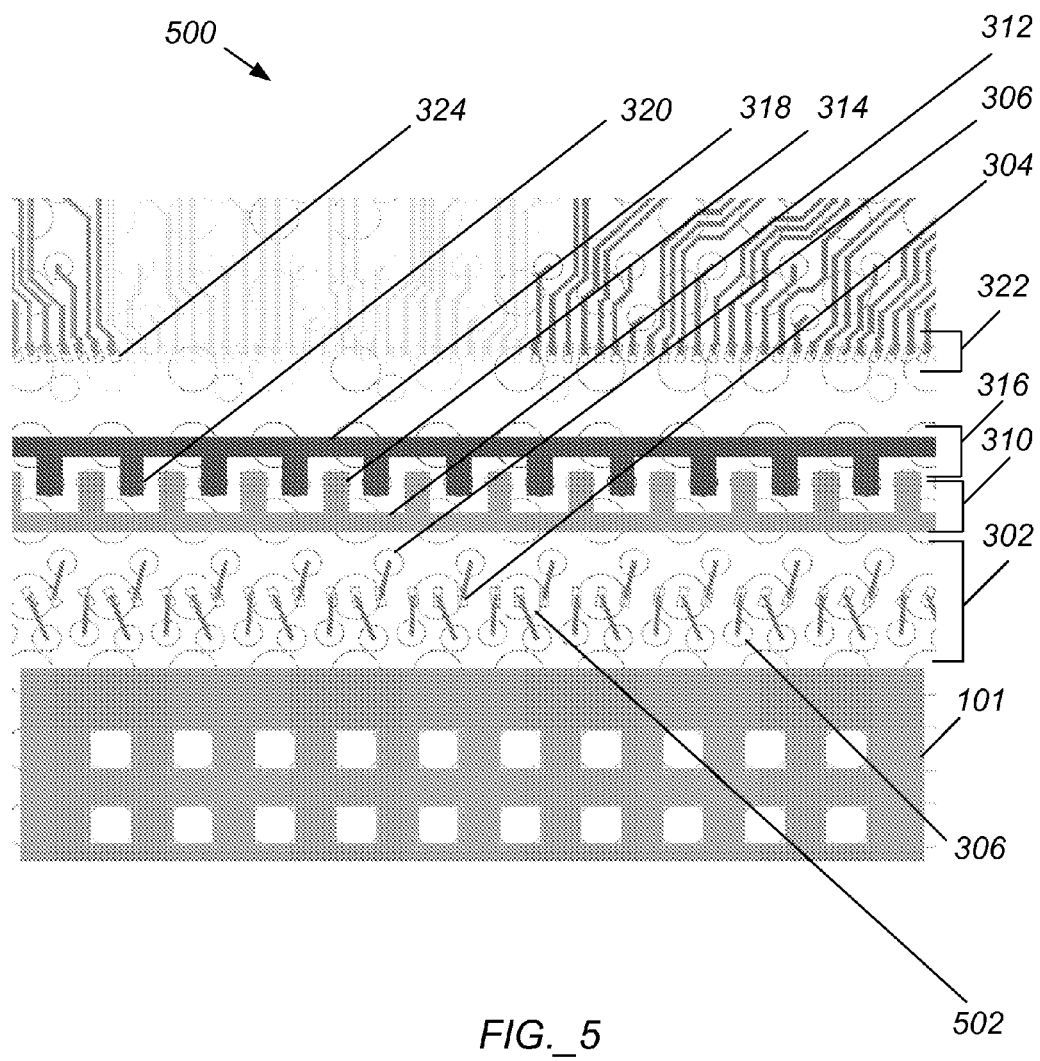
FIG._5

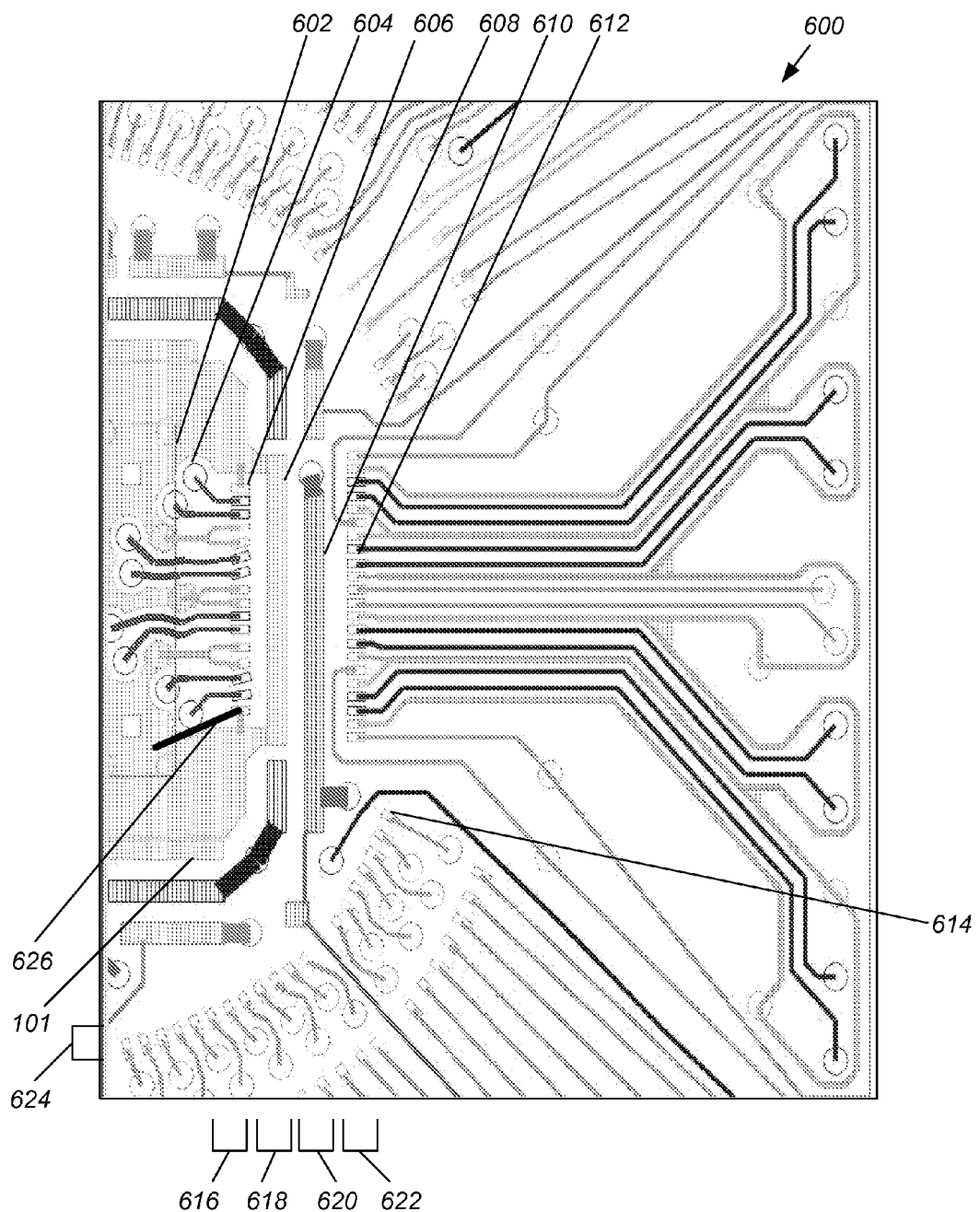
FIG._6

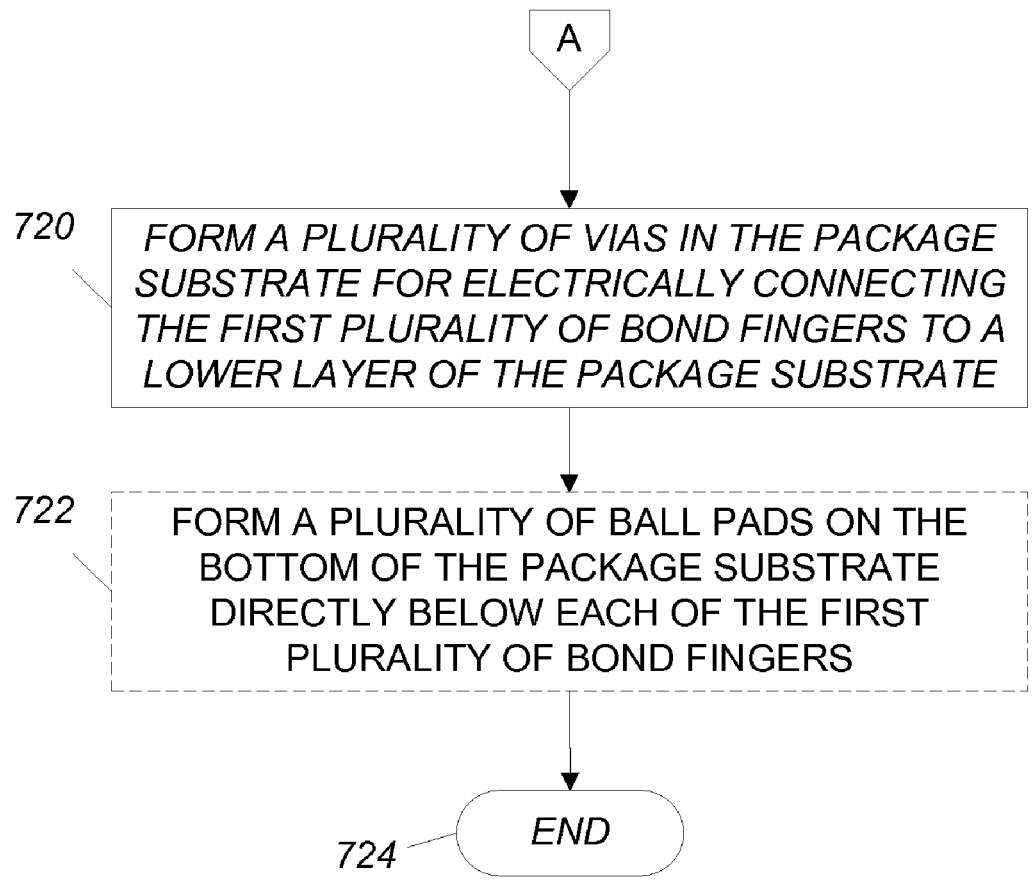
FIG._7B
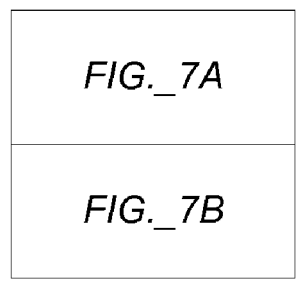
FIG._7

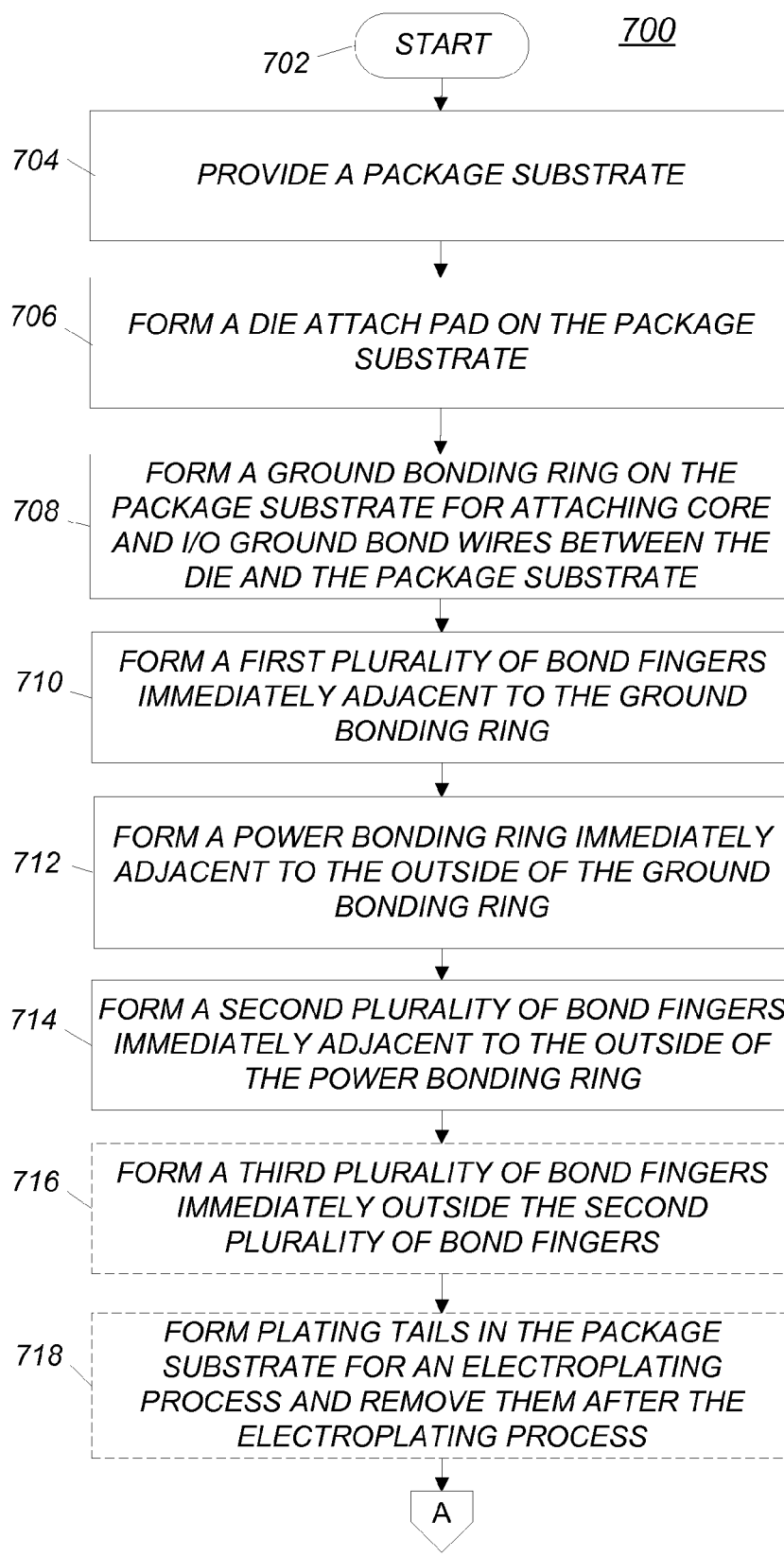
FIG._7A

WIRE BOND INTEGRATED CIRCUIT PACKAGE FOR HIGH SPEED I/O

BACKGROUND OF THE INVENTION

1. Field of the Invention

The present invention is directed to the design and manufacture of integrated circuits. More specifically, but without limitation thereto, the present invention is directed to the design of a wire bond integrated circuit package for high speed I/O.

2. Description of Related Art

An integrated circuit package substrate commonly includes a package substrate having several electrically conductive planar layers separated from one another by electrically insulating layers. Connections between the electrically conductive layers, typically metal layers, are made by forming vias in the electrically insulating layers, typically dielectric layers, and depositing an electrically conductive material in the vias, such as copper. Circuits are formed in the metal layers by etching away a portion of the metal, for example, to form traces in routing metal layers and contact pads in contact pad metal layers. The contact pads are used to make electrical connection between the integrated circuit package and a printed circuit board. Some metal layers in the integrated circuit package are used to conduct a voltage supply and others to conduct a ground return to the routing metal layers and to the contact pad metal layers. In a wire bond package substrate, contact is made between the package and an integrated circuit die by metal bond wires.

SUMMARY OF THE INVENTION

In one embodiment, an integrated circuit package substrate includes:
 a package substrate;
 a die attach pad formed on the package substrate for securing a die to the package substrate;
 a ground bonding ring formed on the package substrate for attaching core and I/O ground bond wires between the die and the package substrate; and
 a first plurality of bond fingers formed immediately adjacent to the ground bonding ring for attaching a first set of I/O signal bond wires between the package substrate and the die.

In another embodiment, a method of making an integrated circuit package includes steps of:
 providing a package substrate;
 forming a die attach pad on the package substrate for securing an integrated circuit die;
 forming a ground bonding ring on the package substrate for attaching core and I/O ground bond wires between the die and the package substrate; and
 forming a first plurality of bond fingers immediately adjacent to the ground bonding ring for attaching a first set of I/O signal bond wires between the package substrate and the die.

BRIEF DESCRIPTION OF THE DRAWINGS

The above and other aspects, features and advantages will become more apparent from the description in conjunction with the following drawings presented by way of example and not limitation, wherein like references indicate similar elements throughout the several views of the drawings, and wherein:

FIG. 1 illustrates a top view of a portion of a first metal layer of a wire bond package of the prior art;

FIG. 2 illustrates a top view of a portion of a third metal layer of the wire bond package of FIG. 1;

FIG. 3 illustrates a top view of a portion of a first metal layer of an embodiment of a wire bond package for high speed I/O;

FIG. 4 illustrates a top view of the wire bond package of FIG. 3 without plating tails;

FIG. 5 illustrates a top view of an embodiment of a wire bond package for high speed I/O including ball pads;

FIG. 6 illustrates a top view of a portion of a first metal layer of an embodiment of a wire bond package for high speed I/O with three sets of bond fingers; and FIG. 7 illustrates a flow chart for a method of making the integrated circuit package of FIGS. 3, 4, 5, and 6.

Elements in the figures are illustrated for simplicity and clarity and have not necessarily been drawn to scale. For example, the dimensions, sizing, and/or relative placement of some of the elements in the figures may be exaggerated relative to other elements to clarify distinctive features of the illustrated embodiments. Also, common but well-understood elements that may be useful or necessary in a commercially feasible embodiment are often not depicted in order to facilitate a less obstructed view of the illustrated embodiments.

DESCRIPTION OF THE ILLUSTRATED EMBODIMENTS

The following description is not to be taken in a limiting sense, rather for the purpose of describing by specific examples the general principles that are incorporated into the illustrated embodiments. For example, certain actions or steps may be described or depicted in a specific order to be performed. However, practitioners of the art will understand that the specific order is only given by way of example and that the specific order does not exclude performing the described steps in another order to achieve substantially the same result. Also, the terms and expressions used in the description have the ordinary meanings accorded to such terms and expressions in the corresponding respective areas of inquiry and study except where other meanings have been specifically set forth herein.

In integrated circuits such as serializer/deserializer (SERDES) devices that convert a serial data stream to or from a parallel data stream, high data transfer rates may require fast switching speeds in the frequency range of 2-3 GHz and higher. At these frequencies, the parasitic inductance resulting from the length of the bond wires and the reflected signals from the plating tails in the integrated circuit package may result in a deterioration of the signal waveform and a correspondingly reduced circuit performance.

FIG. 1 illustrates a top view of a portion of a first metal layer of a wire bond package 100 of the prior art. Shown in FIG. 1 are a die attach area 101, a first tier 102, a core ground bonding ring 104, a second tier 106, a core power bonding ring 108, a third tier 110, I/O power bonding pads 112, an I/O ground bonding pad 114, a fourth tier 116, a first set of bond fingers 118, a fifth tier 120, a second set of bond fingers 122, and a package boundary 124.

The wire bond package 100 is partitioned into a series of wire bond package features located in a succession of regions defined from the die attach area 101 in the center of the wire bond package 100 to the package boundary 124. These regions are referred to as the first tier 102, the second tier 106, the third tier 110, the fourth tier 116, and the fifth tier 120.

The first tier 102 includes the core ground bonding ring 104 at the outside edge of the die attach area of the wire bond package 100. Ground bond wires (not shown) are attached from the die (not shown) to the ground bonding ring 104 when the die is connected to the wire bond package 100.

The second tier 106 outside the first tier 102 includes the core power bonding ring 108. Power bond wires (not shown) are attached from the die to the core power bonding ring 108 when the die is connected to the wire bond package 100.

The third tier 110 outside the second tier 106 includes the I/O power bonding pads 112 and the I/O ground bonding pad 114. I/O power and ground bond wires (not shown) are attached from the die to the I/O power bonding pads 112 and the I/O ground bonding pad 114 when the die is connected to the wire bond package 100.

The fourth tier 116 includes the first set of bond fingers 118. I/O signal bond wires (not shown) are attached from the die to the bond fingers 118 when the die is connected to the wire bond package 100. The I/O signal bond wires attached to the first set of bond fingers 118 have the lowest inductance to meet the higher frequency specifications of the die for I/O signals such as a data bit stream.

The fifth tier 120 includes the second set of bond fingers 122. Additional signal bond wires (not shown) are attached from the die to the bond fingers 122 when the die is connected to the wire bond package 100. The additional signal bond wires attached to the second set of bond fingers 122 are for signals that have less demanding frequency specifications such as test signals. The second metal layer of the wire bond package (not shown) is typically a ground plane that attenuates crosstalk and controls the impedance of the net traces in the first metal layer.

FIG. 2 illustrates a top view 200 of a portion of a third metal layer of the wire bond package 100 of FIG. 1. Shown in FIG. 2 are plating tails 202 and a package boundary 204.

During the manufacturing process used to make the wire bond package 100, an electric current is conducted through the copper wire traces in the wire bond package 100 to electroplate the copper, for example, with layers of nickel and gold. The plating tails 202 provide an electrical path between the nets in the wire bond package 100 and a shorting bar (not shown) that connects the package boundary 204 of the wire bond package 100 to the electroplating current. The shorting bar is removed after electroplating the wire traces in the wire bond package 100.

The length of the bond wires required to connect the die to the first set of bond fingers 118 in the wire bond package substrate 100 of FIG. 1 depends on the package type. Typically, the maximum bond wire length lies in a range from two to five millimeters. At signal frequencies above four gigaHertz, the inductance of the bond wires and the capacitive crosstalk coupling may result in severe distortion of the signal waveform communicated between the die and the bond fingers 118. The embodiments of the wire bond package substrate for high speed I/O described below overcome these disadvantages and provide other benefits as follows.

In one embodiment, an integrated circuit package substrate includes:

a package substrate;

a die attach pad formed on the package substrate for securing a die to the package substrate;

a ground bonding ring formed on the package substrate for attaching core and I/O ground bond wires between the die and the package substrate; and a first plurality of bond fingers formed immediately adjacent to the ground bonding ring for attaching a first set of I/O signal bond wires between the package substrate and the die.

FIG. 3 illustrates a top view of a portion of a first metal layer of an embodiment of a wire bond package 300 for high speed I/O. Shown in FIG. 3 are a die attach area 101, a first tier 302, a first set of bond fingers 304, I/O vias 306, plating tails 308, a second tier 310, a ground bonding ring 312, ground vias 314, a third tier 316, a power bonding ring 318, power vias 320, a fourth tier 322, and a second set of bond fingers 324.

The first tier 302 includes the first set of bond fingers 304, the I/O vias 306, and the plating tails 308. The plating tails 308 may be included for an electroplating process to electroplate metal traces inside the wire bond package 300 and removed after the electroplating process. Alternatively, the plating tails 308 may be omitted if they are not needed for the electroplating process.

The second tier 310 includes the ground bonding ring 312. The ground bonding ring 312 is used to connect both the core ground wires and the I/O ground wires from the die to the wire bond package 300. In the arrangement of FIG. 3, the bond fingers 304 are placed immediately adjacent to the ground bonding ring 312 and immediately adjacent to the die attach area 101. The term "immediately adjacent" means that there are no intervening structures other than vias between the bond fingers 304 and the ground bonding ring 312 in the top metal layer of the wire bond package 300. The bond fingers 304 are preferably made of an electrically conductive material such as copper and may have any shape and size, for example, a rectangle having a width of 105 microns and a length of 250 microns. The bond fingers 304 are connected to the immediately adjacent I/O vias 306 by short traces to route the I/O signals to the lower layers of the wire bond package 300.

Placing the bond fingers 304 immediately adjacent to ground bonding ring 312 and immediately adjacent to the die attach area 101 advantageously reduces the length of the bond wires needed to connect the die to the wire bond package 300 compared to the wire bond package 100 of FIG. 1. For example, the length of the bond wires between the die and the bond fingers 304 may be less than one millimeter. The reduced length readily accommodates I/O signals that have high frequency specifications, for example, in the range from 4-10 GHz.

Another advantage of the arrangement of FIG. 3 is that the bond wires carrying I/O signals may also be shielded from crosstalk by routing the core and I/O power and ground bond wires in between the signal wires.

The third tier 316 includes the power bonding ring 318 and the power vias 320. The power bonding ring 318 is connected to the multiple power vias 320 spaced at intervals, for example, of one millimeter. If desired, the power bonding ring 318 may be cut at selected points including one or more of the power vias 320 to divide the power bonding ring 318 into segments. Each segment of the power bonding ring 318 may then be used to connect the die to a separate voltage source.

The fourth tier 322 includes the second set of bond fingers 324, which may be identical to the second set of bond fingers in the fifth tier 120 of the wire bond package 100 of FIG. 1.

The plating tails 308 that connect the vias 306 to the ground bonding ring 312 may be included as an option for plating processes that require the electrical connection to the ground bonding ring 312 and removed afterward, for example, by an etch back process after plating. Alternatively, the plating tails 308 may be omitted for plating processes used for gold plating the nets in the wire bond package 300 that do not require plating tails, for example, full body gold and direct immersion gold (DIG).

FIG. 4 illustrates a top view of the wire bond package 300 of FIG. 3 excluding plating tails. Shown in FIG. 4 are a die attach area 101, first tier 302, a first set of bond fingers 304, I/O vias 306, a second tier 310, a ground bonding ring 312, ground vias 314, a third tier 316, a power bonding ring 318, power vias 320, a fourth tier 322, and a second set of bond fingers 324.

In the arrangement of FIG. 4, the plating tails 308 in FIG. 3 are omitted if not needed for an electroplating process, or they are removed after the electroplating process. Excluding the plating tails 308 from the wire bond package 400 advantageously avoids the problems of bond wire inductance and plating tail reflections, resulting in a wire bond package that has superior frequency performance compared to the wire bond package 100 of FIG. 1.

FIG. 5 illustrates a top view of an embodiment of a wire bond package 500 for high speed I/O including ball pads. Shown in FIG. 5 are a first tier 302, a first set of bond fingers 304, I/O vias 306, a second tier 310, a ground bonding ring 312, ground vias 314, a third tier 316, a power bonding ring 318, power vias 320, a fourth tier 322, a second set of bond fingers 324, and ball pads 502.

In FIG. 5, each of the ball pads 502 is located on the bottom of the package substrate directly below one of the bond fingers 304 to facilitate the connections between the wire bond package 500 and a printed circuit board. Alternatively, the ball pads 502 may be placed near the outer edge of the wire bond package 500 to facilitate the connections between the wire bond package 500 and a printed circuit board.

The embodiments of the wire bond package for high speed I/O in FIGS. 3, 4, 5, and 6 advantageously reduce the maximum bond wire length from two to five millimeters, for example, to less than one millimeter. The corresponding reduction in bond wire inductance coupled with the omission or removal of plating tails advantageously avoids degradation of the signal waveforms in the wire bond packages in FIGS. 3, 4, 5, and 6 at signal frequencies in the range, for example, of 4-10 GHz.

FIG. 6 illustrates a top view of a portion of a first metal layer of an embodiment of a wire bond package 600 for high speed I/O with three sets of bond fingers. Shown in FIG. 6 are a die attach area 101, a die edge 602, Tx vias 604, Tx bond fingers 606, a ground bonding ring 608, a power bonding ring 610, Rx bond fingers 612, a third set of bond fingers 614, a first tier 616, a second tier 618, a third tier 620, a fourth tier 622, a fifth tier 624, and a bond wire 626.

In the arrangement of FIG. 6, two sets of high speed I/O bond fingers are formed, the Tx bond fingers 606 and the Rx bond fingers 612. The first tier 616 includes the Tx bond fingers 606. The second tier 618 includes the ground bonding ring 608. The Tx bond fingers 606 are formed immediately inside the ground bonding ring 608 to provide shortest bond wire length for the Tx (transmit) I/O signals. The ground bonding ring 608 is formed in the die attach area 101. The third tier 620 includes the power bonding ring 610. The fourth tier 622 includes the Rx bond fingers 612. The Rx bond fingers 612 are formed immediately outside the power bonding ring 610 to provide the next shortest bond wire length for the Rx (receive) I/O signals. The fifth tier 624 includes the third set of set of bond fingers 614, which may be used for slower speed signals, such as test signals. Only one bond wire 626 is shown to avoid obstructing the details of the wire bond package 600.

The various features of the embodiments of FIGS. 4, 5, and 6 described above may be combined to practice various embodiments within the scope of the appended claims. For example, the plating tails 308 of FIG. 3 may be formed between the Tx bond fingers 606 and the ground bonding ring 608 in FIG. 6 and etched away after electroplating in the same manner as described above with reference to FIG. 3.

In another embodiment, a method of making an integrated circuit package includes steps of:
  providing a package substrate;
  forming a die attach pad on the package substrate for securing an integrated circuit die;
  forming a ground bonding ring on the package substrate for attaching core and I/O ground bond wires between the die and the package substrate; and
  forming a first plurality of bond fingers immediately adjacent to the ground bonding ring for attaching a first set of I/O signal bond wires between the package substrate and the die.

FIG. 7 illustrates a flow chart 700 for a method of making the integrated circuit package of FIGS. 3, 4, 5, and 6.

Step 702 is the entry point for the flow chart 900.

In step 704, a package substrate is provided according to well known integrated circuit package manufacturing techniques.

In step 706, a die attach pad is formed on the package substrate for securing an integrated circuit die according to well known techniques.

In step 708, a ground bonding ring is formed on the package substrate for attaching core and I/O ground bond wires between the die and the package substrate. The ground bonding ring may be formed in FIG. 3, for example, in the same manner as the core power bonding ring 108 in FIG. 1, or the ground bonding ring may be formed in the die attach area as in FIG. 6.

In step 710, a first plurality of bond fingers is formed immediately adjacent to the ground bonding ring for attaching a first set of I/O signal bond wires between the package substrate and the die. The first set of I/O signal bond wires may optionally be formed adjacent to the inside of the ground bonding ring.

In step 712, a power bonding ring for attaching core and I/O power bond wires between the die and the package substrate is formed immediately adjacent to the outside of the ground bonding ring. The power bonding ring may optionally be formed in segments for connecting the I/O and core power bond wires to multiple voltage sources.

In step 714, a second plurality of bond fingers is formed immediately adjacent to an outside of the power bonding ring for attaching a second set of I/O signal bond wires between the package substrate and the die.

In step 716, a third plurality of bond fingers is formed immediately outside the second plurality of bond fingers for attaching a third set of I/O signal bond wires between the package substrate and the die.

In step 718, plating tails may optionally be formed in the package substrate for an electroplating process and removed after the electroplating process. Alternatively, the plating tails may be omitted from the package substrate when not needed for the electroplating process.

In step 720, a plurality of vias is formed in the package substrate for electrically connecting the first plurality of bond fingers to at least one lower layer of the package substrate.

In step 722, ball pads may optionally be formed on the bottom of the package substrate directly below each of the first plurality of bond fingers for connecting the package substrate to a printed circuit board. Each of the ball pads is electrically connected to one of the plurality of vias.

Step 724 is the exit point of the flow chart 700.

Although the flowchart description above is described and shown with reference to specific steps performed in a specific order, these steps may be combined, sub-divided, or reordered without departing from the scope of the claims. Unless specifically indicated, the order and grouping of steps is not a limitation of other embodiments that may lie within the scope of the claims.

The specific embodiments and applications thereof described above are for illustrative purposes only and do not preclude modifications and variations that may be made within the scope of the following claims.

What is claimed is:

1. An integrated circuit package comprising:
   a package substrate;
   a die attach pad formed on the package substrate for securing a die to the package substrate;
   a ground bonding ring formed on the package substrate for attaching core and I/O ground bond wires between the die and the package substrate;
   a first plurality of bond fingers formed immediately adjacent to an inside of the ground bonding ring for attaching a set of transmit I/O signal bond wires between the package substrate and the die;
   a power bonding ring formed immediately adjacent to an outside of the ground bonding ring for attaching I/O and core power bond wires between the die and the package substrate, wherein the ground bonding ring is disposed between the power bonding ring and the first plurality of bond fingers;
   a second plurality of bond fingers formed immediately adjacent to an outside of the power bonding ring for attaching a set of receive I/O signal bond wires between the package substrate and the die, wherein the power bonding ring is disposed between the second plurality of bond fingers and the ground bonding ring; and
   a third plurality of bond fingers formed immediately outside the second plurality of bond fingers for attaching another set of I/O signal bond wires between the package substrate and the die, wherein the second plurality of bond fingers is disposed between the third plurality of bond fingers and the power bonding ring;
   wherein the power bonding ring is electrically connectable to a first voltage source;
   wherein the ground bonding ring is electrically connectable to a second voltage source which is separate from the first voltage source;
   wherein the set of transmit I/O signal bond wires are of shorter length than the set of receive I/O signal bond wires.

2. The integrated circuit package of claim 1 wherein the transmit I/O signal bond wires are one millimeter or less in length.

3. The integrated circuit package of claim 1 further comprising the ground bonding ring formed in the die attach pad.

4. The integrated circuit package of claim 1 wherein the I/O and core power bond wires are routed in between the transmit I/O signal bond wires.

5. The integrated circuit package of claim 1 wherein the power bonding ring comprises a plurality of physically divided segments for connecting the I/O and core power, bond wires to multiple voltage sources.

6. The integrated circuit package of claim 1, the integrated circuit package substrate excluding plating tails.

7. The integrated circuit package of claim 1, the integrated circuit package substrate further comprising a plurality of vias for electrically connecting the first plurality of bond fingers to at least one lower layer of the package substrate.

8. The integrated circuit package of claim 7, the integrated circuit package substrate further comprising a plurality of ball pads formed on the package substrate directly below the first plurality of bond fingers for connecting the package substrate to a printed circuit board, each of the ball pads electrically connected to one of the plurality of vias.

9. The integrated circuit package of claim 1, wherein at least one of the power bonding ring and the ground bonding ring is a single continuous ring.

10. The integrated circuit package of claim 1, wherein the integrated circuit package substrate comprises one or more plating tails.

11. A method of making an integrated circuit package comprising steps of:
    providing a package substrate;
    forming a die attach pad on the package substrate for securing an integrated circuit die to the package substrate;
    forming a ground bonding ring on the package substrate for attaching core and I/O ground bond wires between the die and the package substrate; and
    forming a first plurality of bond fingers immediately adjacent to an inside of the ground bonding ring for attaching a set of transmit I/O signal bond wires between the package substrate and the die;
    forming a power bonding ring immediately adjacent to an outside of the mind bonding ring for attaching core and I/O power bond wires between the die and the package substrate, wherein the ground bonding ring is disposed between the power bonding ring and the first plurality of bond fingers;
    forming a second plurality of bond fingers immediately adjacent to an outside of the power bonding it for attaching a set of receive I/O signal bond wires between the package substrate and the die, wherein the power bonding ring is disposed between the second plurality of bond fingers and the ground bonding ring; and
    forming a third plurality of, bond fingers immediately outside the second plurality of bond fingers for attaching another set of I/O signal bond wires between the package substrate and the die, wherein the second plurality of bond fingers is disposed between the third plurality of bond fingers and the power bonding ring;
    wherein the power bonding ring is electrically connectable to a first voltage source;
    wherein the ground bonding ring is electrically connectable to a second voltage source which is separate from the first voltage source;
    wherein the set of transmit I/O signal bond wires are of shorter length than the set of receive I/O signal bond wires.

12. The method of claim 11 further comprising forming the ground bonding ring in the die attach pad.

13. The method of claim 11 wherein the core and I/O power bond wires are routed in between the transmit I/O signal bond wires.

14. The method of claim 11 further comprising a step of forming the power bonding ring in segments for connecting the I/O and core power bond wires to multiple voltage sources.

15. The method of claim 11 further comprising steps of forming plating tails in the package substrate for an electroplating process and removing the plating tails after the electroplating process.

16. The method of claim 11 further comprising forming a plurality of vias for electrically connecting the first plurality of bond fingers to at least one lower layer of the package substrate.

17. The method of claim 11 further comprising forming a plurality of ball pads on the package substrate directly below one of the first plurality of bond fingers for connecting the package substrate to a printed circuit board, each of the ball pads electrically connected to one of the plurality of vias.

* * * * *